United States Patent [19]

Jackson, H. Spence

[11] Patent Number: 5,028,881
[45] Date of Patent: Jul. 2, 1991

[54] HIGHLY LINEAR OPERATIONAL TRANSCONDUCTANCE AMPLIFIER WITH LOW TRANSCONDUCTANCE

[75] Inventor: Jackson, H. Spence, Austin, Tex.

[73] Assignee: Motorola, Inc., Schaumburg, Ill.

[21] Appl. No.: 518,386

[22] Filed: May 3, 1990

[51] Int. Cl.$^5$ ............................................. H03F 3/45
[52] U.S. Cl. .................................... 330/253; 330/257; 330/311
[58] Field of Search ........................ 330/253, 257, 311

[56] References Cited

U.S. PATENT DOCUMENTS 4,059,808 11/1977 Sakamoto et al. ............... 330/261 X

OTHER PUBLICATIONS

A Very-Linear CMOS Transconductance Stage for OTA-C Filters; Peter M. VanPeteghem, et al.; IEEE 1989 Custom Integrated Circuits Conference; pp. 25.3.1–25.3.4.

Primary Examiner—James B. Mullins
Attorney, Agent, or Firm—Paul J. Polansky

[57] ABSTRACT

An operational transconductance amplifier (OTA) with improved linearity and improved dynamic range operating on a single five-volt supply. The OTA comprises a virtual ground circuit, a current diverting portion for diverting current through first and second paths to the virtual ground circuit substantially proportional to a differential input voltage, a resistive portion, a current mirror for mirroring currents in the first and second paths into third and fourth paths, respectively, and output stage biasing for providing differential output currents. The resistive portion comprises first and second saturated MOS transistors, the voltage-current characteristics of the MOS transistors making them operate as large-valued resistors because of the short channel effect. The saturated MOS transistors improve linearity and dynamic range by decreasing the variation in output current caused by fluctuations in input voltage. In one form, the current mirror portion is implemented using PNP bipolar transistors.

15 Claims, 1 Drawing Sheet

HIGHLY LINEAR OPERATIONAL TRANSCONDUCTANCE AMPLIFIER WITH LOW TRANSCONDUCTANCE

FIELD OF THE INVENTION

This invention relates generally to amplifier circuits, and more particularly, to operational transconductance amplifiers.

BACKGROUND OF THE INVENTION

Operational transconductance amplifiers (OTAs) are useful in applications such as telecommunications. For example, an OTA-C filter, built using an OTA with a capacitor, is a substitute for a more expensive switched capacitor filter. OTAs receive an input voltage and in response provide a current whose magnitude is defined by the transconductance of the OTA. Transconductance, $g_m$, is defined as the change in output current divided by the change in input voltage, or $$g_m = \Delta I / \Delta V \quad (1)$$

where $\Delta I$ is the change in output current, and $\Delta V$ is the change in input voltage. In another form, the input voltage and the output current may be differential. OTAs may have different values for $g_m$ suited for particular applications. For example, it is desirable for low frequency filters to have low values for $g_m$, in the range of 360–800 nanoamperes/volt, so that the accompanying capacitor need not be too large. Large-valued capacitors cannot be implemented on monolithic integrated circuits.

An ideal OTA has infinite input impedance and infinite output impedance. Linearity of the OTA can be measured by the ratio of signal to total harmonic distortion (THD), in decibels or percent. Dynamic range can be measured by the range of input voltages at a given power supply voltage. In addition, it is preferable for OTAs to operate from commonly available 5-volt power supplies. Real OTAs, however, fall short of the ideal characteristics. The performance of different known OTA designs is summarized by Van Peteghem et al. in "A Very-Linear CMOS Transconductance Stage for OTA-C Filters", *IEEE* 1989 *Custom Integrated Circuits Conference*. As discussed by Van Peteghem et al., known OTAs trade off linearity, dynamic range, and operating voltage. This tradeoff is to some extent inherent in transistor technology. MOS transistors and bipolar transistors both exhibit nonlinear input/output characteristics. MOS transistors amplify an output current in response to an input voltage defined by the equation $$I_{DS} = (K'W/2L)(V_{GS} - V_T)^2 \quad (2)$$

where $I_{DS}$ is the drain-to-source current, $K'$ is the Boltzmann constant, W is the gate width of the transistor, L is the gate length of the transistor, $V_{GS}$ is the gate-to-source voltage of the transistor, and $V_T$ is the transistor threshold. Thus the output current of a MOS transistor is related to the input voltage by a square law. For small changes in $V_{GS}$, where $V_{GS}$ is close to $V_T$, the characteristic is approximately linear, and this feature can be used to improve the linearity of the OTA. However, requiring only small variations in $V_{GS}$ limits the dynamic range.

One method to improve the linearity for MOS transistor OTAs is source degeneration. In MOS transistor OTAs, typically two transistors receiving a differential input signal on their respective gates, have their sources connected together and selectively divert a current driven by a constant-current sink. When source degeneration is used, resistors are connected between the sources of the input transistors and the current sink. The resistors decrease the effect of a change in the differential voltage on the gates of the transistors to the change in the output current, because most of the voltage drop occurs across the resistors. Source degeneration improves linearity and lowers $g_m$. To implement source degeneration, resistors or MOS transistors operated in the linear range may be used. However, integrated circuit resistors commonly implemented as diffusions in the semiconductor body introduce nonlinearities. Furthermore, use of resistors and linear region MOS transistors worsens dynamic range.

BRIEF DESCRIPTION OF THE INVENTION

Accordingly, it is an object of the present invention to provide an improved operational transconductance amplifier.

Another object of the present invention to provide an improved highly linear operational transconductance amplifier with low transconductance.

In carrying out these and other objects of the invention, there is provided, in one form, a linear operational transconductance amplifier with low transconductance comprising a virtual ground circuit, a current diverting portion, a resistive portion, a current mirror, and a bias circuit. The virtual ground circuit provides a virtual ground on a node and sinks a current from the node to a first power supply voltage terminal. The current diverting portion is coupled to the virtual ground circuit, and diverts the current through first and second circuit paths in a percentage substantially proportional to a difference between first and second input voltages. The resistive portion drops a voltage in each of the first and second circuit paths, the voltage in each circuit path being substantially proportional to a current therethrough. The current mirror is coupled to the resistive portion, and mirrors a proportionate amount of current flowing in the first path to a third circuit path. The bias circuit is coupled to the current mirror, and establishes a voltage at a predetermined node of the amplifier in response to the current mirrored in the third circuit path, and provides an output current through the predetermined node to a load.

These and other objects, features and advantages will be more clearly understood from the following detailed description taken in conjunction with the accompanying drawings.

DETAILED DESCRIPTION OF THE INVENTION

Figure 1:
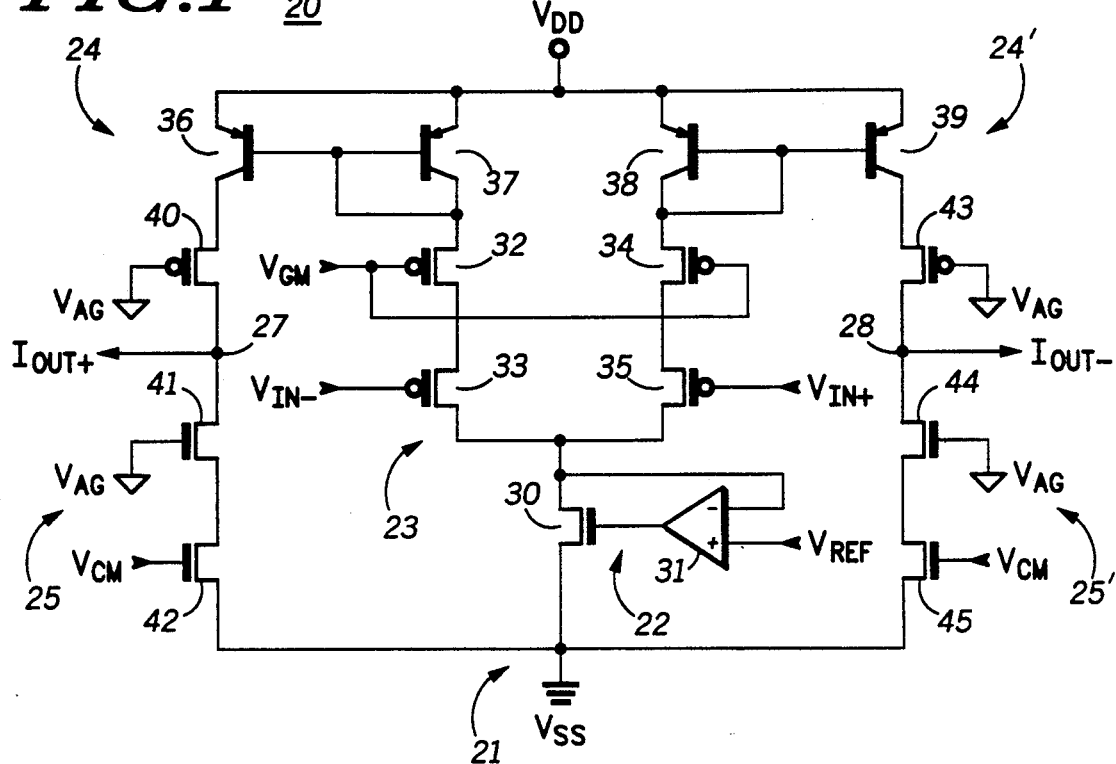
FIG. 1 illustrates in partial schematic form a first embodiment of the present invention useful if P-channel transistors with a linear saturation region are available.

FIG. 1 illustrates an operational transconductance amplifier (OTA) 20 useful if P-channel transistors with a linear saturation region are available. OTA 20 comprises generally an input stage 21, current mirror portions 24 and 24', and output stages 25 and 25'. Input stage 21 further comprises a virtual ground circuit 22 and a current diverting portion 23. Virtual ground circuit 22 comprises an N-channel transistor 30, and an operational amplifier 31. Current diverting portion 23 comprises P-channel transistors 32, 33, 34, and 35. Current mirror portions 24 and 24' comprise PNP transistors 36, 37, and 38, 39 respectively. Output stages 25 and 25' comprise a P-channel transistor 40, N-channel transistors 41 and 42, and a P-channel transistor 43, and N-channel transistors 44 and 45, respectively.

In input stage 21, transistor 30 has a drain, has a gate, and has a source connected to a negative power supply voltage terminal labelled "$V_{SS}$". Operational amplifier 31 has a positive input terminal for receiving a reference voltage labelled "$V_{REF}$", a negative input terminal connected to the drain of transistor 30, and an output terminal connected to the gate of transistor 30. Transistor 32 has a source, a gate for receiving a reference voltage labelled "$V_{GM}$", and a drain. Transistor 33 has a source connected to the drain of transistor 32, a gate for receiving an input voltage labelled "$V_{IN-}$", and a drain, connected to the drain of transistor 30. Transistor 34 has a source, a gate for receiving $V_{GM}$, and a drain. Transistor 35 has a source connected to the drain of transistor 34, a gate for receiving an input voltage labelled "$V_{IN+}$", and a drain connected to the drain of transistor 30.

In current mirror portions 24 and 24', transistor 36 has an emitter connected to a positive power supply voltage terminal labelled "$V_{DD}$", a base, and a collector. Transistor 37 has an emitter connected to $V_{DD}$, a base, and has a collector connected to the base of transistor 37, to the base of transistor 36, and to the source of transistor 32. Transistor 38 has an emitter connected to $V_{DD}$, a base, and a collector connected to both the base of transistor 38 and to the source of transistor 34. Transistor 39 has an emitter connected to $V_{DD}$, a base connected to the collector of transistor 38, and a collector.

In output stages 25 and 25', transistor 40 has a source connected to the collector of transistor 36, a gate connected to an analog ground reference voltage labelled "$V_{AG}$", and a drain connected to a node 27 for providing a current labelled "$I_{OUT+}$" to a first load (not shown). Transistor 41 has a drain connected to the drain of transistor 40, a gate connected to $V_{AG}$, and a source. Transistor 42 has a drain connected to the source of transistor 42, a gate for receiving a reference voltage labelled "$V_{CM}$", and a source connected to a negative power supply voltage terminal labelled "$V_{SS}$". Transistor 43 has a source connected to the collector of transistor 39, a gate for receiving $V_{AG}$, and a drain connected to a node 28 for providing a current labelled "$I_{OUT-}$" to a second load (not shown). Transistor 44 has a drain connected to the drain of transistor 43, a gate connected to $V_{AG}$, and a source. Transistor 45 has a drain connected to the source of transistor 44, a gate for receiving $V_{CM}$, and a source connected to $V_{SS}$.

In operation, OTA 20 receives a differential input voltage on $V_{IN+}$ and $V_{IN-}$, and provides a differential current on $I_{OUT+}$ and $I_{OUT-}$, to the loads not shown in FIG. 1. The transconductance, $g_m$, of amplifier 20 is low to make it suitable for certain applications such as active filters for telecommunications, but the transconductance may be varied by $V_{GM}$. OTA 20 is typically used in a filter in which the cutoff frequency, determined by $g_m$ and the value of the capacitor, is dynamically tuned. The linearity and dynamic range of amplifier 20 are improved, however, primarily through the use of transistors 32 and 34, which operate in the saturation region. The advantage to the performance of amplifier 20 of operating transistors 32 and 34 in this manner will become clear with an understanding of the operation of the circuit. The improvement of linearity and dynamic range occurs despite the fact that OTA 20 operates using a reduced positive power supply voltage, for example five volts.

Virtual ground circuit 22 sinks a current defined by the sizes the transistors in the input stage. Operational amplifier 31 is provided to control not only the current flowing through transistor 30, but also the voltage on the drain of transistor 30. Operational amplifier 31 changes the voltage on its output terminal until the voltages on the positive and negative input terminals are equal, and hence changes the voltage on the gate of transistor 30 until the voltage on the drain of transistor 30 is equal to $V_{REF}$. Since $V_{REF}$ is made substantially independent of fluctuations in power supply voltage, virtual ground circuit 22 improves the power supply rejection of OTA 20. In current diverting portion 23, the differential voltage on $V_{IN+}$ and $V_{IN-}$ controls how the current flows. If $V_{IN+}$ is less than $V_{IN-}$, then more current flows through transistor 35 than through transistor 33. If $V_{IN+}$ is greater than $V_{IN-}$, then more current flows through transistor 33 than transistor 35.

The $g_m$, and hence the resistance, of each of transistors 32 and 34 is set by $V_{GM}$. In an ideal transistor, $I_{DS}$ is independent of drain-to-source voltage ($V_{DS}$) in saturation. However, the $I_{DS}$ of a real transistor increases slightly with increases in $V_{DS}$ in the saturation region. This effect is known as the short-channel effect; as transistor gate lengths are pushed smaller and smaller by advances in manufacturing technology, the short-channel effect becomes more prevalent. The slope of the $V_{DS}$–$I_{DS}$ characteristic, and hence gm, varies with $V_{GS}$. In a saturated MOS transistor, $g_m$ is small and the effective resistance is large. As a result, when $V_{IN+}$ exceeds $V_{IN-}$, the amount of current flowing in a path of current diverting portion 23 comprising transistors 37, 32, and 33, only slightly exceeds the amount of current flowing in a path comprising transistors 38, 34, and 35. This is a desired effect to minimize the overall $g_m$ of OTA 20.

The placement of saturated transistors 32 and 34 in a source follower configuration improves dynamic range over the use of resistors in a standard source degeneration technique. The voltages on the sources of transistors 32 and 34 are each approximately one diode voltage drop below $V_{DD}$, due to the collector-base connections of transistors 37 and 38. The voltages on the sources of input transistors 33 and 35, which are the drains of transistors 32 and 34, follow the input voltages $V_{IN-}$ and $V_{IN+}$, respectively. Therefore, the voltages across transistors 32 and 34 follow the input voltages $V_{IN-}$ and $V_{IN+}$, respectively, and currents flowing through transistors 32 and 34 are proportional to the difference between $V_{IN+}$ and $V_{IN-}$. These two currents are the currents which are mirrored to the output stage and output as $I_{OUT+}$ and $I_{OUT-}$.

In source degeneration, the voltage at the source of an input transistor is affected by the input voltage at the gate of the transistor. Because $I_{DS}$ is related to $V_{GS}$ by a square law (equation 2), and because the voltage drop across a resistor connected to the source of the MOS transistor varies in proportion to $I_{DS}$, the voltage on the source of the MOS transistor varies with changes in the input voltage, and $V_{GS}$ does not change proportionally to changes in the input voltage. To maintain linearity, then, the dynamic range must be kept small. Note that also in OTA 20, operational amplifier 31 controls the source voltages for transistors 33 and 35.

Also, resistors may be used instead of saturated transistors 32 and 34. However, resistors fabricated in an integrated circuit suffer from variation in resistance, leakage current to either the substrate or well caused by a PN junction formed therebetween, capacitance to the substrate, and variable resistance depending on the voltage at a point on the resistor (since the voltage modulates the width of the depletion region of the PN junction). Because the voltage drop across them is large, using large-valued resistors also limits dynamic range. For these reasons, then, saturated MOS transistors are preferred.

Transistors 37 and 36 together form a current mirror which mirrors the current flowing through transistor 33, through transistors 36, 40, 41, and 42. Likewise transistors 38 and 39 form a current mirror which mirrors the current flowing through transistor 35 through transistors 39, 43, 44, and 45. The mirrored currents then flow into the loads. While the illustrated embodiment is a BICMOS circuit, it should be apparent that other types of transistors, such as P-channel MOS transistors, may be used in place of the bipolar transistors of current mirrors 24 and 24'. Since the gate widths of MOS transistors would have to be made quite large to match the performance of the bipolar transistors, a BICMOS circuit is generally preferred if available. Transistors 40 and 41 are cascoded and along with transistor 42 ensure that the output impedance at node 27 is high; likewise, transistors 43 and 44 are cascoded and along with transistor 45 ensure that the output impedance at node 28 is high.

In another embodiment of OTA 20, current mirror 24 and output stage 25 could be omitted, in which case $I_{OUT+}$ and $I_{OUT-}$ are provided by the sources of transistors 32 and 34. In this embodiment, the advantage of using saturated MOS transistors for improving linearity and dynamic range is retained.

Figure 2:
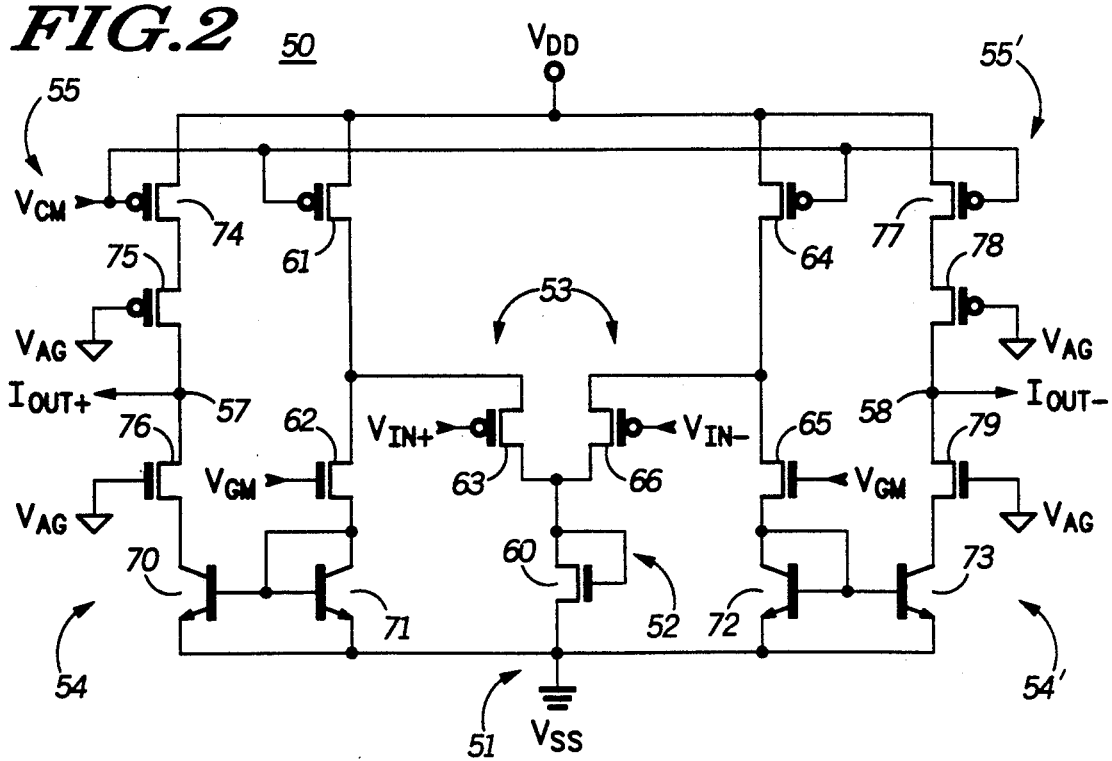
FIG. 2 illustrates in schematic form a second embodiment of the present invention useful if N-channel transistors with a linear saturation region are available.

FIG. 2 illustrates in schematic form a second embodiment of the present invention, OTA 50, which is useful if N-channel transistors with a linear saturation region are available. OTA 50 is very similar to OTA 20 of FIG. 1 and similarities between the two should become apparent. OTA 50 comprises an input stage 51, current mirrors 54 and 54', and output stages 55 and 55'. Input stage 51 further comprises a virtual ground circuit 52 comprising an N-channel transistor 60, and a current diverting portion 53 comprising: a P-channel transistor 61, an N-channel transistor 62, a P-channel transistor 63, a P-channel transistor 64, an N-channel transistor 65, and a P-channel transistor 66. Current mirror 54 comprises NPN transistors 70 and 71. Current mirror 54' comprises NPN transistors 72 and 73. Output stage 55 comprises P-channel transistors 74 and 75, and an N-channel transistor 76. Output stage 55' comprises P-channel transistors 77 and 78, and an N-channel transistor 79.

In input portion 51, transistor 60 has a drain and a gate connected together, and a source connected to $V_{SS}$. Transistor 61 has a source connected to $V_{DD}$, a gate for receiving $V_{CM}$, and a drain. Transistor 62 has a drain connected to the drain of transistor 61, a gate for receiving $V_{GM}$, and a source. Transistor 63 has a source connected to the drain of transistor 61, a gate for receiving $V_{IN+}$, and a drain connected to the drain of transistor 60. Transistor 64 has a source connected to $V_{DD}$, a gate for receiving $V_{CM}$, and a drain. Transistor 65 has a drain connected to the drain of transistor 64, a gate for receiving $V_{GM}$, and a source. Transistor 66 has a source connected to the drain of transistor 64, a gate for receiving $V_{IN-}$, and a drain connected to the drain of transistor 60.

In current mirror portion 54, transistor 70 has an emitter connected to $V_{SS}$, and a collector and a base. Transistor 71 has a collector connected to both the source of transistor 62 and to the base of transistor 70, a base connected to the collector of transistor 71, and an emitter connected to $V_{SS}$. In current mirror portion 54', transistor 72 has a collector connected to the source of transistor 65, a base connected to the collector of transistor 72, and an emitter connected to $V_{SS}$. Transistor 73 has a collector, a base connected to the collector of transistor 72, and an emitter connected to $V_{SS}$.

In output stage 55, transistor 74 has a source connected to $V_{DD}$, a gate for receiving $V_{CM}$, and a drain. Transistor 75 has a source connected to the drain of transistor 74, a gate for receiving $V_{AG}$, and a drain connected to a node 57 for providing current signal $I_{OUT+}$ to a first load (not shown). Transistor 76 has a drain connected to the drain of transistor 75, a gate connected to $V_{AG}$, and a source connected to the collector of transistor 70. In output stage 55', transistor 77 has a source connected to $V_{DD}$, a gate connected to $V_{CM}$, and a drain. Transistor 78 has a source connected to the drain of transistor 77, a gate for receiving $V_{AG}$, and a drain connected to a node 58 for providing current signal $I_{OUT-}$ to a second load (not shown). Transistor 79 has a drain connected to the drain of transistor 77, a gate connected to $V_{AG}$, and a source connected to the collector of transistor 73.

Virtual ground circuit 52 comprises a single transistor, transistor 60. The voltage on the drain of transistor 60 rises until the $V_{DS}$ exceeds the threshold voltage of transistor 60, at which point it begins to conduct current. At a $V_{DS}$ of one threshold voltage, transistor 60 is biased in the saturation region and a substantially constant current flows (ignoring the short-channel effect). The $V_{DS}$ of transistor 60 may change depending on the input voltages to OTA 50, however, as opposed to that of transistor 30 of FIG. 1, and is not as accurate a virtual ground. However, in some applications the slight variability of current flowing poorer virtual ground reference are preferable to the extra integrated circuit area required by the use of an operational amplifier to more accurately set the $V_{DS}$. Furthermore, virtual ground circuit 52 still provides a better power supply rejection than if the drains of transistors 63 and 66 were connected to $V_{SS}$.

Current diverting portion 53 operates substantially similarly to current diverting portion 23 of FIG. 1, except that a reference current is additionally supplied through transistors 61 and 64. Transistors 61 and 64 are provided so that P-channel input transistors may still be used. If $V_{IN+}$ exceeds $V_{IN-}$, relatively more of the current drawn by virtual ground circuit 52 flows through transistor 66. This current is supplied through transistor 64. Since transistor 66 is relatively more conductive, less of the current flowing through transistor 64 flows to $V_{SS}$ through transistors 65 and 72, and thus less current is mirrored onto $I_{OUT-}$. Correspondingly, more current is mirrored onto $I_{OUT+}$. Similarly, if $V_{IN-}$ exceeds $V_{IN+}$, relatively more current flows to the first load as $I_{OUT-}$.

Like OTA 20 of FIG. 1, OTA 50 uses the short-channel effect of saturated MOS transistors to improve linearity and dynamic range while operating at a relatively low positive power supply voltage. In OTA 50, transistors 62 and 65 perform this function. However, unlike OTA 20 of FIG. 1, OTA 50 uses N-channel saturated transistors. All other things being equal, the use of N-channel saturated transistors is preferable because it avoids the problem of impact ionization associated with saturated P-channel transistors. Impact ionization is an effect in which, as $V_{DS}$ increases beyond a certain point, $g_m$ increases.

It should be apparent by now that an operational transconductance amplifier with improved dynamic range and improved linearity operating with a reduced voltage power supply, such as five volts, is herein described. The OTA comprises an input stage having a virtual ground circuit and a current diverting portion, a current mirror, and an output stage. An OTA in accordance with the present invention improves operating performance through the use of saturated MOS transistors in the current diverting portion, coupled to sources of P-channel MOS transistors. The currents formed by positive and negative input voltage signals are mirrored to the output stage, where they are output to loads through high-impedance nodes to ensure a low $g_m$. While the embodiment shown was a differential input voltage to differential output current OTA, it should be apparent that a single-ended current output signal could also be formed. In the input stage, an OTA can be made single-ended by providing a reference voltage as one of the input voltages.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A linear operational transconductance amplifier with low transconductance comprising:
    virtual ground means, for providing a virtual ground on a node and for sinking a current from said node to a first power supply voltage terminal;
    current diverting means coupled to said virtual ground means, for diverting said current through first and second circuit paths in a percentage substantially proportional to a difference between first and second input voltages;
    resistive means, for dropping a voltage in each of said first and second circuit paths, the voltage in each circuit path being substantially proportional to a current therethrough;
    current mirror means coupled to said resistive means, for mirroring a proportionate amount of current flowing in said first circuit path to a third circuit path; and
    bias means coupled to said current mirror means, for establishing a voltage at a predetermined node of the amplifier in response to said current mirrored in said third circuit path, and for providing an output current through said predetermined node to a load.

2. The linear operational transconductance amplifier of claim 1 wherein said resistive means comprises first and second transistors having current electrodes respectively coupled within said first and second circuit paths, said first and second transistors each biased in a saturation region.

3. The operational transconductance amplifier of claim 2 wherein said bias means comprises:
    a third transistor having a first current electrode coupled to said current mirror means, a control electrode for receiving a first reference signal, and a second current electrode coupled to said node;
    a fourth transistor having a first current electrode coupled to said second current electrode of said third transistor, a control electrode for receiving said first reference signal, and a second current electrode; and
    a fifth transistor having a first current electrode coupled to said second current electrode of said fourth transistor, a control electrode for receiving a second reference signal, and a second current electrode coupled to said first power supply voltage terminal.

4. The operational transconductance amplifier of claim 2 wherein said current mirror means comprises:
    a third transistor having a first current electrode coupled to a second power supply voltage terminal, a control electrode, and a second current electrode coupled to both said resistive means and to said control electrode thereof; and
    a fourth transistor having a first current electrode coupled to said said second power supply voltage terminal, a control electrode coupled to said second current electrode of said third transistor, and a second current electrode coupled to said bias means.

5. The operational transconductance amplifier of claim 4 wherein said third and fourth transistors are PNP bipolar transistors.

6. The operational transconductance amplifier of claim 2 wherein said current mirror means comprises:
    a third transistor having a first current electrode coupled to said resistive means, a control electrode coupled to said first current electrode of said third transistor, and a second current electrode coupled to said first power supply voltage terminal; and
    a fourth transistor having a first current electrode coupled to said bias means, a control electrode coupled to said first current electrode of said third transistor, and a second current electrode coupled to said first power supply voltage terminal.

7. The operational transconductance amplifier of claim 6, wherein said third and fourth transistors are NPN bipolar transistors.

8. The operational transconductance amplifier of claim 1 wherein said virtual ground means comprises:
    a transistor having a first current electrode coupled to said current diverting means, a control electrode, and a second current electrode coupled to said first power supply voltage terminal; and
    an operational amplifier having a first input terminal for receiving a reference voltage, a second input terminal coupled to said first current electrode of said transistor, and an output terminal coupled to said control electrode of said transistor.

9. In an amplifier circuit, a method of providing first and second current output signals substantially proportional to a difference between first and second input voltages, comprising the steps of:
- providing a virtual ground node for sinking a virtual ground current;
- selectively diverting said virtual ground current through first and second circuit paths in response to first and second input voltages;
- dropping a voltage in said first and second circuit paths substantially proportional to first and second currents therethrough;
- mirroring said first and second currents flowing in said first and second circuit paths to third and fourth circuit paths, respectively;
- establishing a voltage on first and second nodes of the amplifier circuit in response to currents mirrored to said third and fourth, circuit paths respectively; and
- providing the first and second current output signals through said first and second nodes.

10. The method of claim 9, wherein said step of dropping a voltage in said first and second circuit paths is performed by first and second saturated MOS transistors.

11. An operational transconductance amplifier, comprising:
- a virtual ground circuit, for providing a virtual ground node and for sinking a current from said virtual ground node to a first power supply voltage terminal;
- a first transistor having a first current electrode, a control electrode for receiving a first input voltage, and a second current electrode coupled to said node;
- a second transistor having a first current electrode, a control electrode for receiving a second input voltage, and a second current electrode coupled to said node;
- a third transistor having a first current electrode for providing a first current signal, a control electrode for receiving a transconductance signal, and a second current electrode coupled to said first current electrode of said first transistor; and
- a fourth transistor having a first current electrode for providing a second current signal, a control electrode for receiving said transconductance signal, and a second current electrode coupled to said first current electrode of said second transistor.

12. The operational transconductance amplifier of claim 11 further comprising:
- output means having first and second current paths for respectively providing first and second output currents; and
- current mirror means coupled to said output means, to said first current electrode of said third transistor and to said first current electrode of said fourth transistor, for mirroring said first and second current signals to said first and second circuit paths respectively.

13. The operational transconductance amplifier of claim 12 wherein said third and fourth transistors are MOS transistors.

14. The operational transconductance amplifier of claim 13 wherein said transconductance signal biases said third and fourth transistors in a saturation region.

15. The operational transconductance amplifier of claim 12 wherein said first and second transistors are P-channel MOS transistors.

* * * * *